(12) United States Patent
Hatem et al.

(10) Patent No.: US 10,879,055 B2
(45) Date of Patent: Dec. 29, 2020

(54) TECHNIQUES, SYSTEM AND APPARATUS FOR SELECTIVE DEPOSITION OF A LAYER USING ANGLED IONS

(71) Applicant: Varian Semiconductor Equipment Associates, Inc., Gloucester, MA (US)

(72) Inventors: Christopher Hatem, Seabrook, NH (US); Kevin Anglin, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 119 days.

(21) Appl. No.: 16/037,894

(22) Filed: Jul. 17, 2018

(65) Prior Publication Data
US 2020/0027707 A1    Jan. 23, 2020

(51) Int. Cl.
*H01J 37/34* (2006.01)
*H01L 21/263* (2006.01)
(Continued)

(52) U.S. Cl.
CPC .......... *H01J 37/3464* (2013.01); *C23C 14/34* (2013.01); *C23C 14/5873* (2013.01); *H01J 37/32376* (2013.01); *H01J 37/32715* (2013.01); *H01L 21/2633* (2013.01); *H01J 2237/1505* (2013.01); *H01J 2237/20221* (2013.01);
(Continued)

(58) Field of Classification Search
CPC ................ C23C 14/34; C23C 14/5873; H01J 37/32376; H01J 37/32715; H01J 37/3464; H01J 2237/332; H01J 2237/334; H01L 21/02266; H01L 21/02631; H01L 21/2855

USPC .............. 204/192.3, 192.32, 192.33, 192.34, 204/298.36, 298.32
See application file for complete search history.

(56) References Cited

U.S. PATENT DOCUMENTS

2004/0222082 A1* 11/2004 Gopalraja ............. C23C 14/046
204/192.3
2009/0098306 A1* 4/2009 Druz ..................... C23C 14/044
427/523

(Continued)

FOREIGN PATENT DOCUMENTS

JP    2014220415 A    11/2014
JP    2015529744 A    10/2015

OTHER PUBLICATIONS

International Search Report and Written Opinion dated Oct. 25, 2019 for PCT/US2019/040125 filed Jul. 1, 2019.

*Primary Examiner* — Rodney G McDonald
(74) *Attorney, Agent, or Firm* — Kacvinsky Daisak Bluni PLLC

(57) ABSTRACT

A method is provided. The method may include providing a substrate, the substrate comprising a substrate surface, the substrate surface having a three-dimensional shape. The method may further include directing a depositing species from a deposition source to the substrate surface, wherein a layer is deposited on a deposition region of the substrate surface. The method may include performing a substrate scan during the directing or after the directing to transport the substrate from a first position to a second position. The method may also include directing angled ions to the substrate surface, in a presence of the layer, wherein the layer is sputter-etched from a first portion of the deposition region, and wherein the layer remains in a second portion of the deposition region.

18 Claims, 4 Drawing Sheets

(51) Int. Cl.
*H01J 37/32* (2006.01)
*C23C 14/34* (2006.01)
*C23C 14/58* (2006.01)
H01L 21/02 (2006.01)
H01L 21/285 (2006.01)

(52) U.S. Cl.
CPC ... *H01J 2237/332* (2013.01); *H01J 2237/334* (2013.01); *H01L 21/02266* (2013.01); *H01L 21/02631* (2013.01); *H01L 21/2855* (2013.01)

(56) References Cited

U.S. PATENT DOCUMENTS

| | | | |
|---|---|---|---|
| 2014/0034611 A1 | 2/2014 | Godet et al. | |
| 2015/0136732 A1 | 5/2015 | Tang et al. | |
| 2015/0325410 A1* | 11/2015 | Godet | H01J 37/3299 204/192.33 |
| 2016/0148713 A1* | 5/2016 | Nam | H05H 3/06 250/251 |
| 2016/0230268 A1 | 8/2016 | Druz et al. | |
| 2016/0268162 A1 | 9/2016 | Akasaka et al. | |

\* cited by examiner

TECHNIQUES, SYSTEM AND APPARATUS FOR SELECTIVE DEPOSITION OF A LAYER USING ANGLED IONS

FIELD

The present embodiments relate to device processing, and more particularly, to selective deposition of a given material on a substrate.

BACKGROUND

In the present day, semiconductor and other devices are scaled to smaller and smaller sizes, where such devices may be formed of many different materials, having complex structures, often arranged in multiple different layers on a substrate. One approach to address the increasing complexity of materials and device structures is selective formation of a given material on selected portions of a device structure, which approach may be especially useful to address patterning issues of a device at the micrometer level or nanometer level. Present day approaches for selective formation of materials may involve multiple patterning operations, which operations may entail undue complexity and costs.

With respect to these and other considerations the present disclosure is provided.

BRIEF SUMMARY

In one embodiment, a method is provided. The method may include providing a substrate, the substrate comprising a substrate surface, the substrate surface having a three-dimensional shape. The method may further include directing a depositing species from a deposition source to the substrate surface, wherein a layer is deposited on a deposition region of the substrate surface. The method may include performing a substrate scan during the directing or after the directing to transport the substrate from a first position to a second position. The method may also include directing angled ions to the substrate surface, in a presence of the layer, wherein the layer is sputter-etched from a first portion of the deposition region, and wherein the layer remains in a second portion of the deposition region.

In another embodiment, a system may include a process chamber to house a substrate, the substrate comprising a substrate surface, the substrate surface including at least one structure, having a three-dimensional shape. The system may include a deposition source, disposed adjacent the process chamber and arranged to generate depositing species to form a layer on the substrate, and an angled ion source to direct angled ions to the process chamber at an angle of incidence with respect to a perpendicular to a substrate plane. The system may further include a substrate stage, disposed in the process chamber, to scan the substrate from a first position to a second position, and a controller, coupled to the angled ion source, the controller arranged to send at least one control signal to adjust the angle of incidence based upon structure information regarding the at least one structure.

In a further embodiment, an apparatus may include a deposition source, disposed adjacent a process chamber and arranged to generate a depositing species to form a layer on a substrate, disposed in the process chamber. The apparatus may also include an angled ion source to direct angled ions to the process chamber at an angle of incidence with respect to a perpendicular to a substrate plane. The apparatus may further include a controller, coupled to the angled ion source, the controller including a processor and a memory unit coupled to the processor, including a selective deposition control routine. The selective deposition control routine may be operative on the processor to control the angled ion source. The selective deposition control routine may include a sputter control processor to receive structure information for a substrate to be processed during an ion exposure; and calculate the angle of incidence for the angled ions, based upon the structure information.

Figure 1:
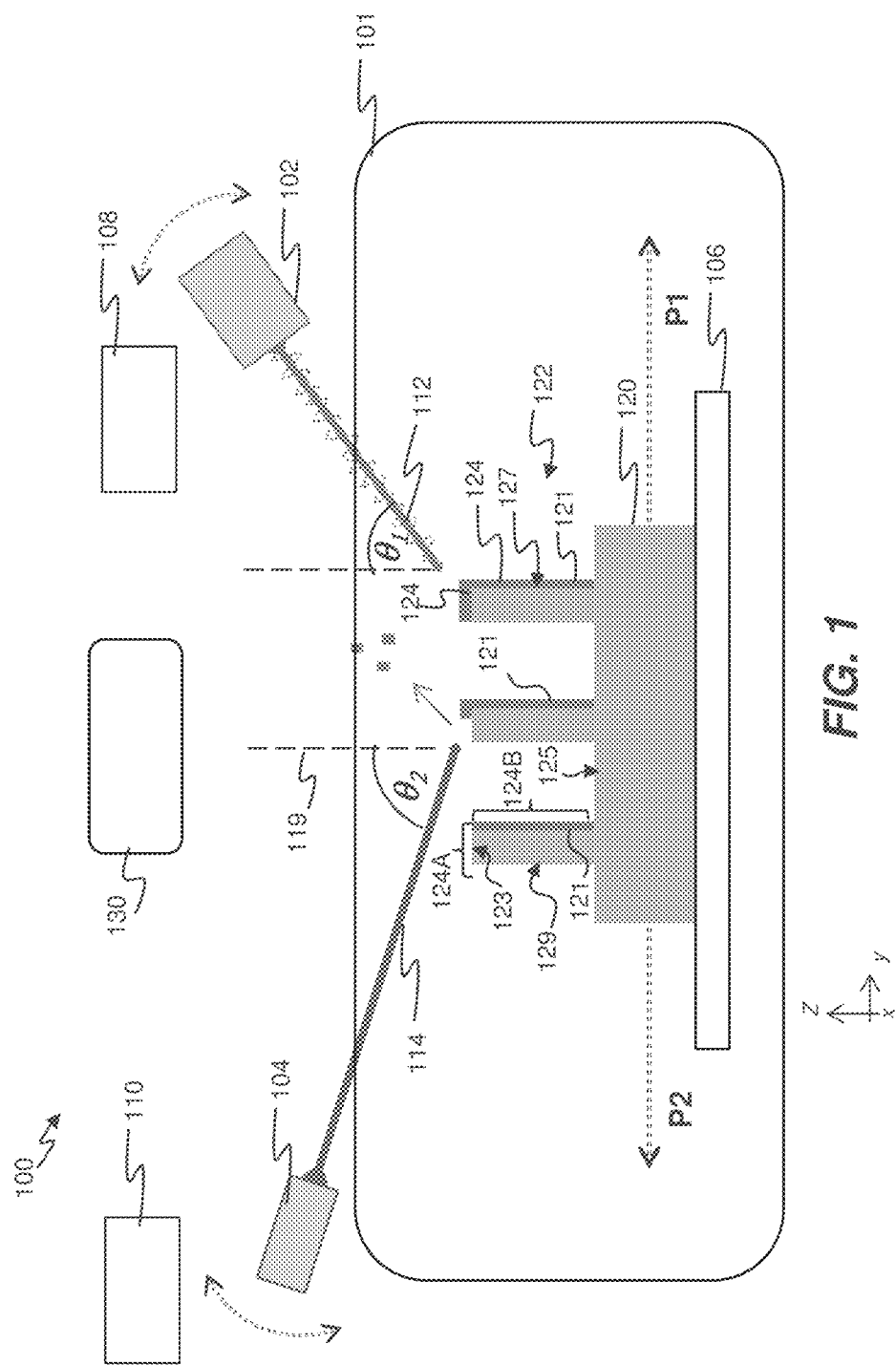
FIG. 1 shows a selective deposition system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with some embodiments, novel approaches for selectively forming a layer on a substrate, and in particular, novel approaches are provided for building device structures using selective formation of a layer, facilitated by angled ions. In various embodiments selective formation of a layer is accomplished using a combination of operations, including a deposition source for deposition of a layer, and an angled ion source for selective removal of portions of the layer. By scanning a workpiece through a chamber coupled to the first ion source and the second ion source, a quasi-selective-deposition process takes place, as detailed in the embodiments to follow.

Turning now to FIG. 1, there is shown a selective deposition system, denoted as deposition system 100, according to embodiments of the disclosure. The deposition system 100 includes a process chamber 101, where the process chamber 101 may house a substrate 120. The substrate 120 may have a substrate surface having a three-dimensional shape, as shown. Examples of a surface having a three dimensional shape include a surface having features standing proud of a substrate plane, such as mesas, lines, pillars, hemispheres; cavities extending into a substrate, such as vias, trenches, and so forth. As such, a given portion of a surface may extend in a different direction than another portion of the surface. In the example of FIG. 1, the substrate surface includes structures 122, which structures may be arranged as lines, pillars, or mesas in some embodiments. Notably, the structures 122 may not be drawn to scale, especially with respect to the process chamber 101. In some examples, the structures 122 may have dimensions along the X-, Y-, or Z-direction on the order of micrometers, hundreds of nanometers, tens of nanometers, nanometers, and so forth. As such, a substrate 120, having dimensions on the order of millimeters, centimeters, or tens of centimeters, may include a very large number of structures 122, as will be readily appreciated by those of skill in the art.

The deposition system 100 may include a deposition source 102, wherein the deposition source 102 is disposed adjacent the process chamber 101. In other embodiments, the deposition source 102 may be disposed within the process chamber 101. The deposition source 102 may be arranged to generate a deposition beam 112, as a depositing species. In various embodiments, the deposition source 102 may be coupled to a source 108, where the source 108 represents a liquid vapor source, a single gas source, multiple gas sources, a gas manifold, and so forth. The source 108 is coupled to the deposition source 102 to provide at least one species to the deposition source 102. The deposition source 102 may be a chemical vapor deposition source in some embodiments, or may be an ion source, such as any suitable ion source as known in the art. The deposition source 102 may be a plasma source, generating a plasma therein. The embodiments are not limited in this context.

The deposition beam 112 may include ions, neutrals, excited species, where the species of deposition beam 112 may be directed along a given direction to the substrate. In some embodiments, the deposition beam 112 may be a collimated beam and an angled deposition beam, wherein the depositing species are directed along a trajectory defining a non-zero angle of incidence (shown as $\theta_1$) with respect a perpendicular 119 to a substrate plane. For example, a plane of the substrate may be the X-Y plane, and certain regions of the substrate surface may, but need not, also align with or define the substrate plane, such as the top 123 or trench region 124 between structures 122.

As shown, in FIG. 1, the deposition beam 112 generates a layer 121 on the substrate 120. Depending upon the nature of the layer 121, to be generated, the deposition beam 112 may include known vapor species, such as plasma species, radicals, ions, to generate a metal layer, a semiconductor layer, a nitride layer, an oxide layer, a carbon layer, and so forth. While in some embodiments, the layer 121 may deposit in a conformal manner, in other embodiments, a deposition region 124 may not cover an entirety of the surface of the substrate 120. Depending on the exact nature of the three-dimensional surface of the surface of substrate 120, as well as the angle of incidence of the deposition beam 112, the location, shape, and extent of the deposition region 124 may vary. In the example of FIG. 1, the deposition region 124 includes a right sidewall 127 of the structures 122, and a top 123 of the structures 122, while not including the left sidewalls 129.

The deposition system 100 may further include an angled ion source 104, where the angled ion source 104 is disposed to direct angled ions 114 to the substrate surface of substrate 120. The angled ion source 104 may be disposed within process chamber 101, or outside process chamber 101. The angled ion source 104 may be coupled to a gas source 110, where the gas source 110 may represent at least one gas source, such as an inert gas source, oxygen source, nitrogen source, or other gas source. The angled ion source 104 may be configured to generate ions of suitable species, ion energy, and ion flux to sputter etch material from the substrate 120, when the substrate 120 is disposed to intercept the angled ions 114. In various embodiments, the angled ion source 104 may represent any suitable ion source, including a plasma beam source, where the angled ions 114 may form an ion beam having a suitable shape. For example, in some embodiments, the angled ions 114 may be configured as a ribbon beam having a long axis extending along the X-axis. The angled ion source 104 may be arranged to generate the angled ions 114 at trajectories defined by a non-zero angle of incidence (shown as $\theta_2$) with respect a perpendicular 119 to a substrate plane (in this example, the X-Y plane).

The deposition system 100 may include a substrate stage 106, configured to scan the substrate 120. In some embodiments, the substrate stage 106 may be configured to scan the substrate along at least one direction, such as along the Y-axis of the Cartesian coordinate system shown. The substrate stage 106 may scan the substrate over a targeted range, such as between a first position, P1, adjacent the deposition source 102, and a second position, P2, adjacent the angled ion source 104. As such, the substrate 120 may be scanned along the Y-axis so different portions of the substrate 120 are exposed to the angled ions 114 in a sequential manner.

As suggested by FIG. 1, the substrate 120 may be scanned in a manner where the structures 122 are exposed to angled ions 114 after the deposition of layer 121, or concurrently with deposition of the layer 121. As such, while the layer 121 may be deposited on the substrate over the deposition region 124, the angled ions 114 may sputter etch the layer 121, so the layer 121 is removed from a first portion 124A of the deposition region 124 and remains in a second portion 124B of the deposition region 124. A result of processing of the substrate 120 using deposition source 102 and angled ion source 104 is the selective deposition of a layer 121 in a targeted region of the substrate 120, in this case, the second portion 124B.

According to various embodiments, the trajectory for angled ions 114 defining the angle of incidence may be chosen according to the shape and size of the structures 122, as well as the position and size of the targeted region for selective formation of a layer on substrate 120, such as the second portion 124B. The trajectory of angled ions 114 may also be chosen to take into account the sputter yield behavior of the material of layer 121. For example, the trajectory of angled ions 114 may be chosen according to an angle of incidence with respect to a given surface where sputter yield is maximized. The trajectory of the angled ions 114 may further be chosen wherein at a designed angle of incidence, the angled ions generate a first sputter yield of a first material of the layer 121, higher than a second sputter yield of a second material of the substrate 120. Said differently, the angled ions 114 may be directed at surfaces where the layer 121 is to be etched at an angle of incidence where the angled ions 114 selectively sputter-etch the layer 121 with respect to the substrate 120. In this manner, angled ions 114, even if provided as inert gas (non-reactive) ions, may selectively remove the layer 121 with respect to substrate 120.

In further embodiments, the trajectory of the angled ions may be further chosen to take into account the initial extent of coverage of the layer 121, meaning the extent of coverage of the deposition region 124. Conversely, the trajectory of the deposition beam 112 may be adjusted (meaning the value of $\theta_2$), to take into account the position, and extent of the second portion 124B, where the layer 121 is to remain, as well as the sputter yield behavior of materials, such as the material of layer 121 and substrate 120. In other words, the angle of incidence of deposition beam 112 may be adjusted so the first portion 124A where material of layer 121 is to be removed may be located where the angled ions 114 can be directed an appropriate angle of incidence to selectively sputter-etch the layer 121, while minimizing etching of substrate 120, as explained further below.

Thus, while the formation of the layer 121 in the second portion 124B may entail more than one distinct operation, the deposition of layer 121, scanning of substrate 120, and sputter removal of layer 121 in first portion 124A act in concert to define a selective deposition process.

In additional embodiments, an angled deposition source may direct depositing species along as a collimated beam wherein the depositing species are directed along a trajectory defining a zero angle of incidence (shown as $\theta_1$) with respect a perpendicular 119 to a substrate plane, meaning the depositing species have trajectories along the perpendicular 119. In these additional embodiments, the deposition region may initially cover the tops 123, and trenches 125, while not covering the left sidewalls 129 or right sidewalls 127. The angled ions 114 may then be targeted in a manner to selectively remove a portion of the deposition region, such as material from the tops 123, while leaving material in the trenches 125, and so forth.

Figure 2:
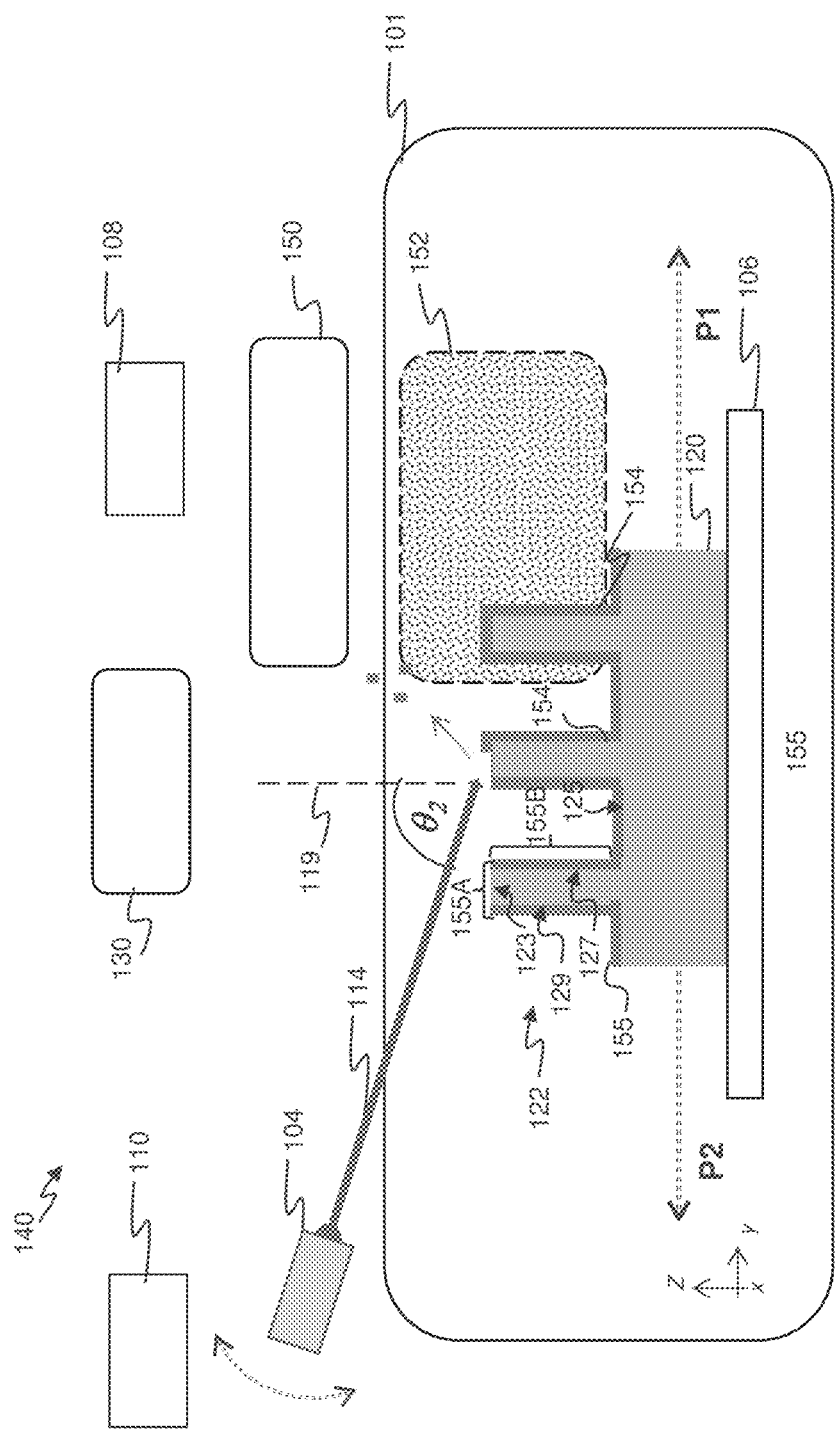
FIG. 2 shows another selective deposition system, according to other embodiments of the disclosure.

Turning now to FIG. 2, there is shown a selective deposition system, denoted as deposition system 140, according to further embodiments of the disclosure. The deposition system 140 may include similar features as deposition system 100, indicated by like reference numbers. Notably, the deposition system 140 differs from the deposition system 100, in that the deposition system 140 includes a deposition source 150, where the deposition source 150 generates a more isotropic manner of deposition of a layer 154, in comparison to the directional deposition of layer 121, shown in FIG. 1. The deposition source 150 may be a plasma deposition source, where a plasma 152 is generated in the process chamber 101. The configuration of the deposition source 150 may be similar to known plasma deposition apparatus, wherein the substrate 120 is immersed in the plasma 152 when disposed at the position P1. As such, condensing species from the plasma 152 may tend to form a conformal coating, shown as layer 154, where the layer 154 coats the various surfaces of the structures 122, in the deposition region 155. Initially, the deposition region 155 may cover an entirety of the surface of the structures 122, including tops 123, trenches 125, left sidewalls 129, and right sidewalls 127. When the substrate 120 is scanned so the angled ions 114 strike the substrate 120, a portion of the layer 154 may be removed by sputter etching. As a result, the layer 154 may be removed in a first region 155A, while remaining in a second region 155B, of the deposition region 155. In this example, the first region may correspond to the tops 123 of structures 122, while the second region 155B corresponds to other surfaces of the structures 122.

As noted, the angled ions 114 may be arranged to define a non-zero angle of incidence with respect to perpendicular to a substrate plane in a manner to enhance the sputter-etch selectivity of the layer 121 or layer 154 with respect to the substrate 120. According to various embodiments, the deposition system 100 and the deposition system 140 may include a controller 130. The controller 130 may be arranged to adjust operation of various components, including adjusting the value of $\theta_2$, the value of meaning the value of $\theta_1$, according to the material of a layer to be deposited, the material of the substrate 120, the target region for selective deposition of the layer, and other factors. In this context, the "material" of a layer or "material" of a substrate may refer to, at least in part, the material composition, such as the elements of the layer, where the layer and substrate are generally be formed of different materials: tungsten vs silicon, silicon vs silicon oxide, and so forth.

Figure 3C:
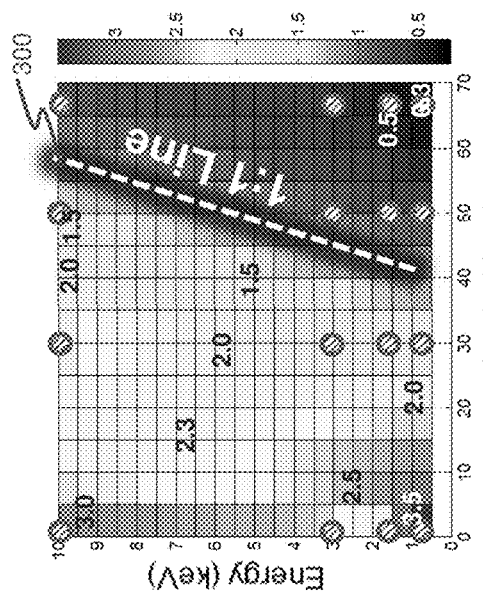
FIG. 3A, FIG. 3B, and FIG. 3C show two dimensional maps of sputtering behavior for Kr ion beam treatment of the tungsten/silicon system.
Figure 3B:
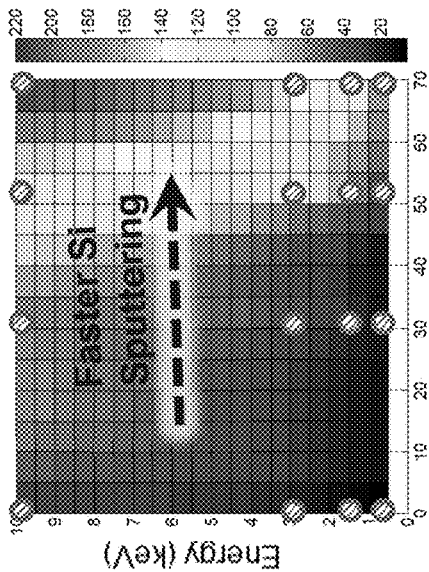
Figure 3A:
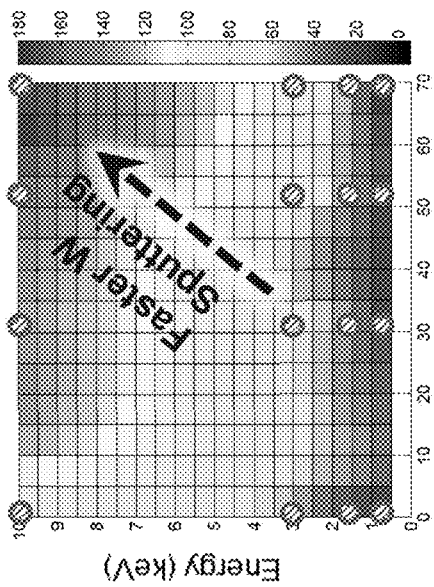

Turning to FIG. 3A, FIG. 3B, and FIG. 3C, there are shown two dimensional maps of sputtering behavior for Kr ion beam treatment of the tungsten/silicon system. The two-dimensional maps illustrate the sputter yield as a function of ion energy and angle of incidence with respect to perpendicular to a substrate plane. In each of the figures, sputter rate or relative sputter rate is depicted by shading, as a function of ion energy (Y-axis) and angle of incidence (X-Axis) with respect to perpendicular to plane of the surface of the material. The graphs are simulations based upon experimental data points, shown as circles. The tungsten (FIG. 3A) and the silicon (FIG. 3B) sputter rate is shown as thickness of a layer than is etched in Angstroms per $1 \times E16/cm^2$ ion dose. While the etch rate tends to increase with increasing angle of incidence and increasing ion energy, as shown by the arrows, the W/Si sputter ratio (FIG. 3C) exhibits more complex behavior. At or near normal incidence (zero degrees) the W/Si sputter ratio is relatively higher, in the range of 2-4, while decreasing at higher angles of incidence. The W/Si sputter ratio is lowest at high angles of incidence (>60 degrees) and low ion energy (less than 2 keV). The behavior as a function of ion energy is more complex: at low angles of incidence (<20 degrees) the W/Si sputter ratio decreases slightly with increased ion energy up to 10 keV, while at higher angles of incidence (>30 degrees) the W/Si sputter ration increases with ion energy. The FIG. 3C also shows a neutral line 300, representing a 1/1 etch ratio for W/Si, meaning the situation where tungsten and silicon sputter equally fast under the ion energy/ion angle represented by any point along the neutral line 300. Accordingly, the information of FIGS. 3A-3C may be used to adjust ion energy and angle of incidence according to facilitate selective deposition on a patterned substrate according to the materials on the surface of the patterned substrate, as well as practical considerations. Such considerations include the range of ion energy available from a given ion source, as well as the practical angle of incidence range available in a given system configuration.

The information, such as the data of FIG. 3C may be used to adjust or set a target angle of incidence for angled ions 114, represented by $\theta_2$, as discussed above. Thus, in an example where the substrate 120 is silicon and the layer 121 is tungsten, to selectively remove tungsten from a given surface, setting the value of $\theta_2$ to generate a high W/Si sputter rate ratio may be useful. In this example, to remove material from the tops 123 as in the scenario of FIG. 1 and FIG. 2, setting $\theta_2$ to a value between zero and 5 degrees at an ion energy of 500 eV corresponds to a W/Si sputter etch ratio of approximately 4/1.

The illustration provided in FIG. 3A-3C for the W/Si/Kr system is merely exemplary. Other combinations of deposition layer material/substrate and ion species will generally yield different sputter etch selectivity behavior. In other embodiments, the angle of incidence of angled ions 114 may be adjusted according to empirically determined behavior for the substrate material/deposition layer material/sputter species system to be employed for selective deposition.

In further embodiments, the angle of incidence as well as the ion energy targeted for the angled ions 114 may take into account the shape of the structure to be processed. For example, referring again to FIG. 2, in some embodiments, a targeted final structure may call for sputter removal of layer 154 from portions of left sidewall 129 as well as top 123. If the left sidewall 129 and top 123 are mutually orthogonal (90) degrees to one another, the angle chosen for $\theta_2$ may accordingly be 45 degrees, to ensure the left sidewall 129 and top 123 receive ions at the same relative angle of incidence with respect to the respective surfaces. Continuing with the data of FIG. 3C where Kr⁺ ions are to be used to etch a layer 154 of tungsten disposed on a substrate of silicon, a higher W/Si sputter etch ratio is useful to ensure undue sputtering of silicon in the structures 122 does not take place during removal of the tungsten from the top 123 and left sidewall 129. The data of FIG. 3C dictates setting the ion energy for krypton ions at a relatively high value, since below 3 kV, silicon is sputtered at a higher rate than tungsten. Thus, the ion energy may be set to 10 kV, for example, where W is etched faster than silicon.

Figure 4:
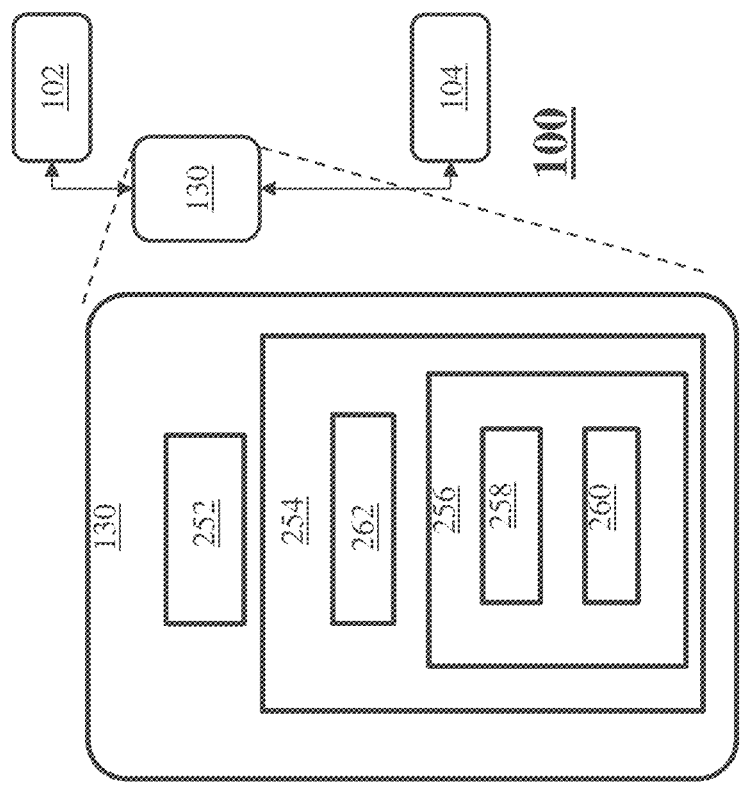
FIG. 4 depicts a block diagram or a processing apparatus in accordance with embodiments of the disclosure.

According to some embodiments, the controller 130 of a system, such as deposition system 100, may be used to adjust and control process parameters to facilitate selective deposition. Turning now to FIG. 4, a block diagram of deposition system 100 is shown, including controller 130, deposition source 102, and angled ion source 104. The controller 130 may be coupled to these components, for example, to send control signals and to receive signals from the components. The controller 130 may include a processor 252, such as a known type of microprocessor, dedicated semiconductor processor chip, general purpose semiconductor processor chip, or similar device. The controller 130 may further include a memory or memory unit 254, coupled to the processor 252, where the memory unit 254 contains a selective deposition control routine 256. The selective deposition control routine 256 may be operative on the processor 252 to monitor and adjust components including the deposition source 102 and the angled ion source 104.

The memory unit 254 may comprise an article of manufacture. In one embodiment, the memory unit 254 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

As further shown in FIG. 4, the selective deposition control routine 256 may include a sputter control processor 258, as well a deposition control processor 260. According to some embodiments, the sputter control processor 258 may receive structure information a for a substrate to be processed during an ion exposure. Examples of the structure information include the height of a feature of a three-dimensional (3-D structure), pitch between adjacent features, the targeted region of a 3-D structure (see, e.g., first portion 124A) to be sputter-etched, material of a layer to be deposited, substrate material, and so forth. The sputter control processor 258 may be arranged to calculate an angle of incidence for angled ions, such as an ion beam generated by the angled ion source 104, based upon the structure information. The sputter control processor 258 may send a control signal to adjust settings on the deposition system 100, where the adjusting of the settings (parameters) has the effect of changing the angle of incidence of the angled ions 114, changing the ion energy of angled ions 114, or both angle of incidence and energy. Accordingly, when the sputter control processor 258 determines based on structure information the angle of incidence or ion energy is to be changed, a control signal may be sent to adjust the angled ion source 104 in a manner to change the angle of incidence of the angled ions 114.

The deposition control processor 260 may be arranged to send a deposition control signal to adjust the angle of incidence of a deposition beam 112, described above, based upon receipt of deposition process information. For example, the deposition information may include some or all of the structure information, discussed above, as well as ion beam information, such as a preferred ion species to be used for the angled ions 114, or a preferred angular range for the angle of incidence for angled ions 114.

As also shown in FIG. 4, the memory unit 254 may include a database 262, where the database may include structure information or deposition information, among other data.

Figure 5:
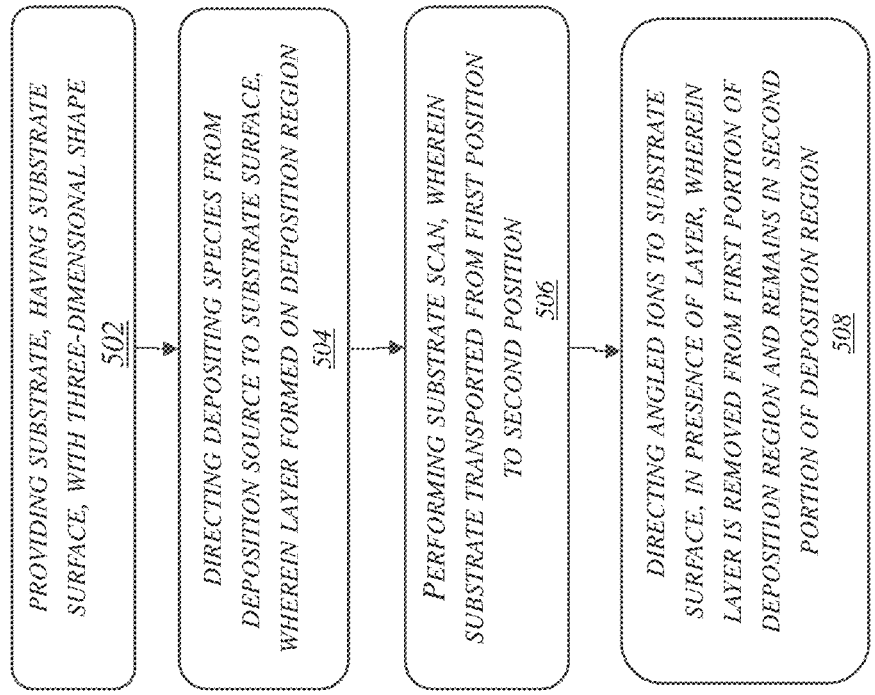
FIG. 5 depicts an exemplary process flow.

FIG. 5 depicts an exemplary process flow 500, according to embodiments of the disclosure. At block 502, a substrate is provided having a surface with a three-dimensional shape. In various embodiments, the surface may include features standing proud of a substrate plane, such as mesas, lines, pillars, hemispheres; cavities extending into a substrate, such as vias, trenches, and so forth.

At block 504, depositing species are directed from a deposition source to the substrate surface, wherein a layer is formed on a deposition region of the substrate surface. In some embodiments, the deposition region may be limited to less than the entirety of the substrate surface, while in other embodiments, the deposition region may cover the whole of the substrate surface. In some embodiments where the substrate surface includes three-dimensional structure(s), the deposition region may cover a first part of a three-dimensional structure, while the layer does not form on a second part of the three-dimensional structure. For example, in various embodiments, the depositing species may be directed an angled beam at an angled of incidence where the second part of the three-dimensional structure is shadowed from the angled beam so depositing species do not "see" the second part to form a shadowed region. In other embodiments, an entirety of a substrate may be exposed to depositing species, such as in a plasma deposition chamber, where the depositing species may isotropically impinge on the substrate surface to cover the whole of the substrate, including the whole of three-dimensional structures on the substrate surface.

At block 506, a substrate scan is performed to transport the substrate from a first position to a second position. In the first position, the substrate may be disposed to intercept depositing species from the deposition source, while in the second position the substrate is disposed to intercept angled ions from an angled ion source. In some embodiments, just a first region of the substrate may be exposed to the depositing species at a given instance, wherein different regions of the substrate are successively exposed to the depositing species as the substrate is scanned from the first position to the second position.

At block 508, angled ions are directed to the substrate surface, in the presence of the layer. As such, the layer may be removed from a first portion of the deposition region, while the layer remains in a second portion of the deposition region. In various embodiments, the angled ions may be provided from an ion source generating sputtering ions for etching the layer in the first portion of the deposition region. The angle of incidence (with respect to a perpendicular to a substrate plane) may be arranged to take into account the shape and size of the three-dimensional structures, as well as the material of the layer and material of the substrate. In various embodiments, the angle of incidence may be adjusted to increase the layer material/substrate material sputter ratio, to reduce or minimize etching of the substrate, while ensuring removal of the layer in the first portion of the deposition region.

In sum, the present embodiments provide the advantage of the ability to perform selective deposition of a material on a 3-D structure without the use of a mask. The present embodiments also provide the additional advantage of selectively depositing material in 3-D surfaces while avoiding complex schemes, requiring multiple processing tools.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a substrate, the substrate comprising a substrate surface, the substrate surface having a three-dimensional shape, and including a plurality of structures, the plurality of structures comprising a top, a trench and a plurality of sidewalls;
   directing a depositing species from a deposition source to the substrate surface, wherein a layer is deposited on a deposition region of the substrate surface, the deposition region comprising the top and at least one sidewall of the plurality of sidewalls;
   performing a substrate scan during the directing or after the directing to transport the substrate from a first position to a second position; and
   directing angled ions to the substrate surface, in a presence of the layer, wherein the layer is sputter-etched to remove the layer from a first portion of the deposition region, and wherein the layer remains in a second portion of the deposition region, wherein the first portion comprises the top, and wherein the second portion comprises at least one sidewall of the plurality of sidewalls.

2. The method of claim 1, wherein the deposition source comprises a first ion source, the first ion source directing the depositing species at a first non-zero angle of incidence with respect to a perpendicular to a plane of the substrate, wherein the deposition region comprises less than an entirety of the substrate surface.

3. The method of claim 2, wherein the substrate surface comprises a shadowed region, wherein the layer does not form on the shadowed region.

4. The method of claim 2, wherein the angled ions are directed from a second ion source at a second non-zero angle of incidence with respect to the plane of the substrate.

5. The method of claim 1, wherein the deposition source comprises a plasma source, wherein the layer is deposited in an isotropic manner on the substrate surface.

6. The method of claim 1, wherein the substrate surface comprises a first material, wherein the layer comprises a second material, the method further comprising:
   setting a target angle for the angled ions, the target angle comprising a non-zero angle of incidence with respect to a perpendicular to a targeted surface of the substrate, the targeted surface disposed within the deposition region,
   wherein at the target angle, the angled ions generate a first sputter yield on the first material and a second sputter yield on the second material, greater than the first sputter yield.

7. The method of claim 6, wherein a ratio of the second sputter yield to the first sputter yield is greater than 2/1.

8. The method of claim 7, further comprising: adjusting an ion energy of the angled ions to a target ion energy, based upon sputter yield behavior as a function of energy for the first material and the second material, wherein the ratio is increased.

9. The method of claim 1, wherein the deposition source comprises a first ion source, the first ion source directing the depositing species at a zero angle of incidence with respect to a perpendicular to a plane of the substrate, wherein the deposition region comprises less than an entirety of the substrate surface.

10. A system, comprising:
    a process chamber to house a substrate, the substrate comprising a substrate surface, the substrate surface including at least one structure, having a three-dimensional shape;
    a deposition source, disposed adjacent the process chamber and arranged to generate depositing species at a first angle of incidence with respect to a perpendicular to a substrate plane to form a layer on the substrate;
    an angled ion source to direct angled ions to the process chamber at a second angle of incidence with respect to a perpendicular to a substrate plane, opposite the first angle of incidence;
    a substrate stage, disposed in the process chamber, to scan the substrate from a first position to a second position; and
    a controller coupled to the angled ion source, the controller arranged to send at least one control signal to adjust the angle of incidence based upon structure information regarding the at least one structure, the structure information comprising at least one of a height of the at least one structure and a pitch between adjacent structures of the at least one structure.

11. The system of claim 10, wherein the deposition source is arranged to generate an angled deposition beam.

12. The system of claim 10, wherein the deposition source comprises a first ion source.

13. The system of claim 12, wherein the angled ion source comprises a second ion source, the second ion source being adjacent the process chamber and arranged to direct sputtering ions at the substrate surface.

14. The system of claim 10, the structure information further comprising a targeted region of the substrate surface to be sputter etched, a material composition of the layer, or a material composition of the substrate.

15. An apparatus, comprising:
a deposition source, disposed adjacent a process chamber and arranged to generate a depositing species at a first angle of incidence with respect to a perpendicular to a substrate plane to form a layer on a substrate, disposed in the process chamber;
an angled ion source to direct angled ions to the process chamber at a second angle of incidence, opposite the first angle of incidence with respect to a perpendicular to a substrate plane; and
a controller, coupled to the angled ion source, the controller comprising:
a processor; and
a memory unit coupled to the processor, including a selective deposition control routine, the selective deposition control routine operative on the processor to control the angled ion source, the selective deposition control routine comprising a sputter control processor to:
receive structure information for a substrate to be processed during an ion exposure; and
calculate the angle of incidence for the angled ions, based upon the structure information, the structure information comprising at least one of a height of the at least one structure and a pitch between adjacent structures of the at least one structure.

16. The apparatus of claim 15, the sputter control processor to send a control signal to adjust the angled ion source to change the second angle of incidence of the angled ions.

17. The apparatus of claim 15, the structure information further comprising a targeted region of the substrate to be sputter etched, a material composition of the layer, or a material composition of the substrate.

18. The apparatus of claim 15, the selective deposition control routine further comprising a deposition control processor, arranged to:
receive deposition process information; and
send a deposition control signal to adjust the first angle of incidence of the depositing species based upon the deposition process information, the deposition process information comprising the structure information, a preferred ion species for the angled ions, or a preferred angular range for the angle of incidence of the angled ions.

* * * * *